United States Patent
Chen et al.

(10) Patent No.: US 8,664,982 B2
(45) Date of Patent: Mar. 4, 2014

(54) BUCK-BOOST POWER CONVERTER WITH FEED-FORWARD TECHNIQUE FOR ACHIEVING FAST LINE RESPONSE

(75) Inventors: Ke-Horng Chen, Banqiao (TW);
Pin-Chin Huang, Taipei (TW);
Hsin-Hsin Ho, Sanchong (TW)

(73) Assignee: Richtek Technoloy Corp., Hsinchu (TW)

( * ) Notice: Subject to any disclaimer, the term of this patent is extended or adjusted under 35 U.S.C. 154(b) by 250 days.

(21) Appl. No.: 12/720,022

(22) Filed: Mar. 9, 2010

(65) Prior Publication Data

US 2010/0231272 A1    Sep. 16, 2010

(30) Foreign Application Priority Data

Mar. 13, 2009 (TW) ................................ 98108281 A

(51) Int. Cl.
*H03K 4/06* (2006.01)
(52) U.S. Cl.
USPC ........... 327/134; 327/131; 327/137; 323/282; 323/288

(58) Field of Classification Search
USPC ............................ 327/131, 134, 137; 323/288
See application file for complete search history.

(56) References Cited

U.S. PATENT DOCUMENTS

| | | | |
|---|---|---|---|
| 6,166,527 A * | 12/2000 | Dwelley et al. | 323/222 |
| 6,348,781 B1 * | 2/2002 | Midya et al. | 323/224 |
| 2007/0210782 A1 * | 9/2007 | Prexl et al. | 323/288 |
| 2009/0108823 A1 * | 4/2009 | Ho et al. | 323/282 |

* cited by examiner

*Primary Examiner* — John Poos
(74) *Attorney, Agent, or Firm* — Muncy, Geissler, Olds & Lowe, P.C.

(57) ABSTRACT

A buck-boost power converter includes a power stage to convert an input voltage to an output voltage, an error amplifier to generate an error signal according to a reference voltage and a feedback signal proportional to the output voltage, a ramp generator to provide two ramp signals, and two comparators to generate two control signals according to the error signal and the two ramp signals to drive the power stage. By using feed-forward technique, one of the two ramp signals has a peak varying with the input voltage and the other ramp signal has a valley varying with the input voltage, so that the power converter has fast line response.

35 Claims, 11 Drawing Sheets

BUCK-BOOST POWER CONVERTER WITH FEED-FORWARD TECHNIQUE FOR ACHIEVING FAST LINE RESPONSE

FIELD OF THE INVENTION

The present invention is related generally to a buck-boost power converter and, more particularly, to a ramp generator for a buck-boost power converter.

BACKGROUND OF THE INVENTION

As shown in FIG. 1, a conventional buck-boost power converter 10 includes a power stage 12 to convert an input voltage Vin to an output voltage Vout according to control signals PWM1 and PWM2 for a load RL, voltage divider resistors R1 and R2 to divide the output voltage Vout to generate a feedback signal VFB, an error amplifier 20 to amplify the difference between the feedback signal VFB and a reference voltage Vref to generate an error signal VEA, a compensator 18 to compensate the error signal VEA for stabilization enhancement of the entire system, a ramp generator 22 to provide ramp signals SAWbuck and SAWboost, and comparators 14 and 16 to generate the control signals PWM1 and PWM2 according to the error signal VEA and the ramp signals SAWbuck and SAWboost. FIG. 2 is a waveform diagram of the buck-boost power converter 10 operating in a buck mode, in which waveform 24 represents the input voltage Vin, waveform 26 represents the ramp signal SAWbuck, waveforms 28 and 30 represent the error signal VEA, and waveform 32 represents the control signal PWM1. The buck-boost power converter 10 uses a negative feedback control loop to modify the impact caused by the variation of the input voltage Vin and the variation of the load RL on the output voltage Vout. Taking the variation of the input voltage Vin for example, when the input voltage Vin drops down from Vin1 to Vin2, as shown by the waveform 24 at time t 1, due to insufficient energy the output voltage Vout will decrease first before the feedback loop responds thereto. Since the feedback signal VFB is connected to a negative input of the error amplifier 20, the error signal VEA increases from VEA1 to VEA2, as shown by the waveforms 28 and 30. In addition, since the buck ramp signal SAWbuck has a fixed amplitude and a fixed period, as shown by the waveform 26, the duty of the control signal PWM 1 will be increased, as shown by the waveform 32, to pull the output voltage Vout back to the preset value. However, the error amplifier 20 needs compensation for stability of the power converter 10. Therefore, the closed loop and the compensator 18 will make the error signal VEA being unable to have fast line response, i.e. instant response to the variation of the input voltage Vin, and in consequence the output voltage Vout could not be rapidly recovered to the preset value.

Therefore, it is desired a solution for a buck-boost power converter to achieve fast line response to stabilize the output voltage.

SUMMARY OF THE INVENTION

An object of the present invention is to provide a buck-boost power converter and a control method thereof, with feed-forward technique for achieving fast line response to stabilize the output voltage of the buck-boost power converter.

Another object of the present invention is to provide a ramp generator and a method thereof for a buck-boost power converter to achieve fast line response to stabilize the output voltage of the buck-boost power converter.

According to the present invention, a buck-boost power converter includes a power stage to convert an input voltage to an output voltage, an error amplifier to generate an error signal according to a reference voltage and a feedback signal proportional to the output voltage, a ramp generator to provide two fixed-period ramp signals, and two comparators to generate two control signals according to the error signal and the two ramp signals for driving the power stage. One of the two ramp signals has a peak varying with the input voltage, and the other of the two ramp signals has a valley varying with the input voltage, by which the duties of the control signals can be changed even without changing the error signal, and in consequence the buck-boost power converter will have fast line response to stabilize the output voltage.

BRIEF DESCRIPTION OF THE DRAWINGS

These and other objects, features and advantages of the present invention will become apparent to those skilled in the art upon consideration of the following description of the preferred embodiments according to the present invention taken in conjunction with the accompanying drawings, in which.

DETAIL DESCRIPTION OF THE INVENTION

Figure 1:
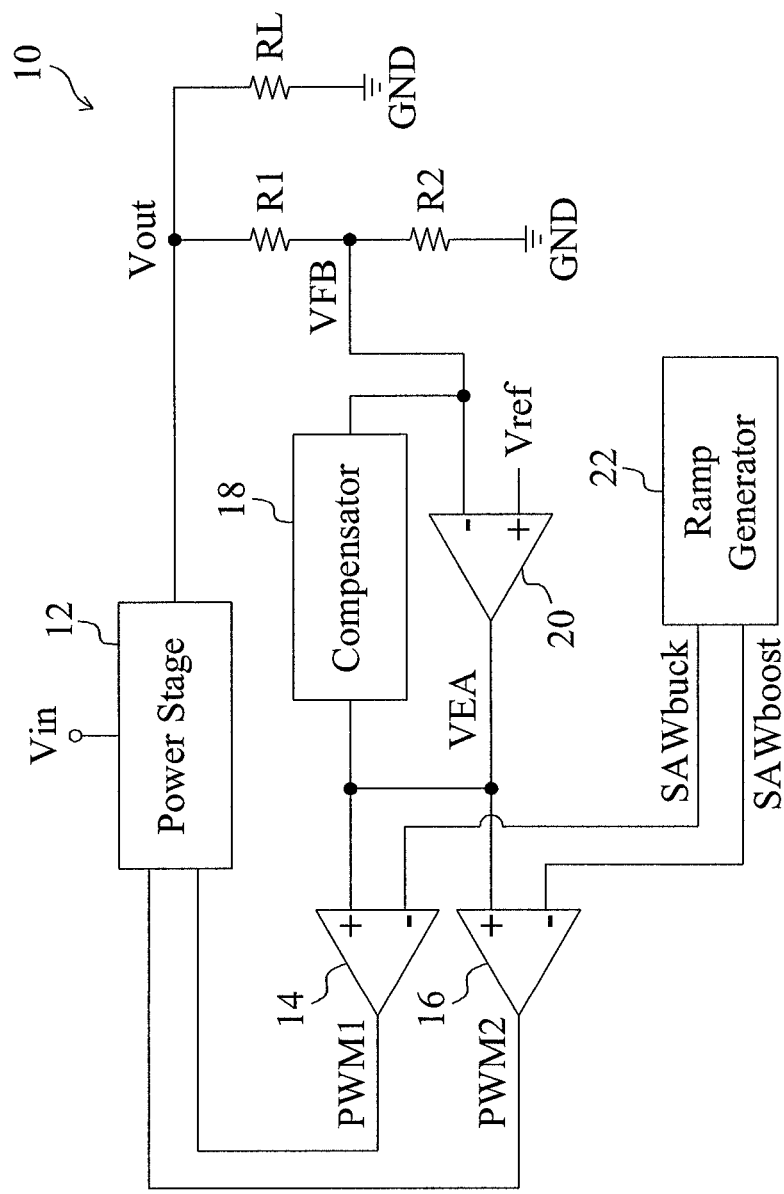
FIG. 1 is a circuit diagram of a conventional buck-boost power converter.
Figure 2:
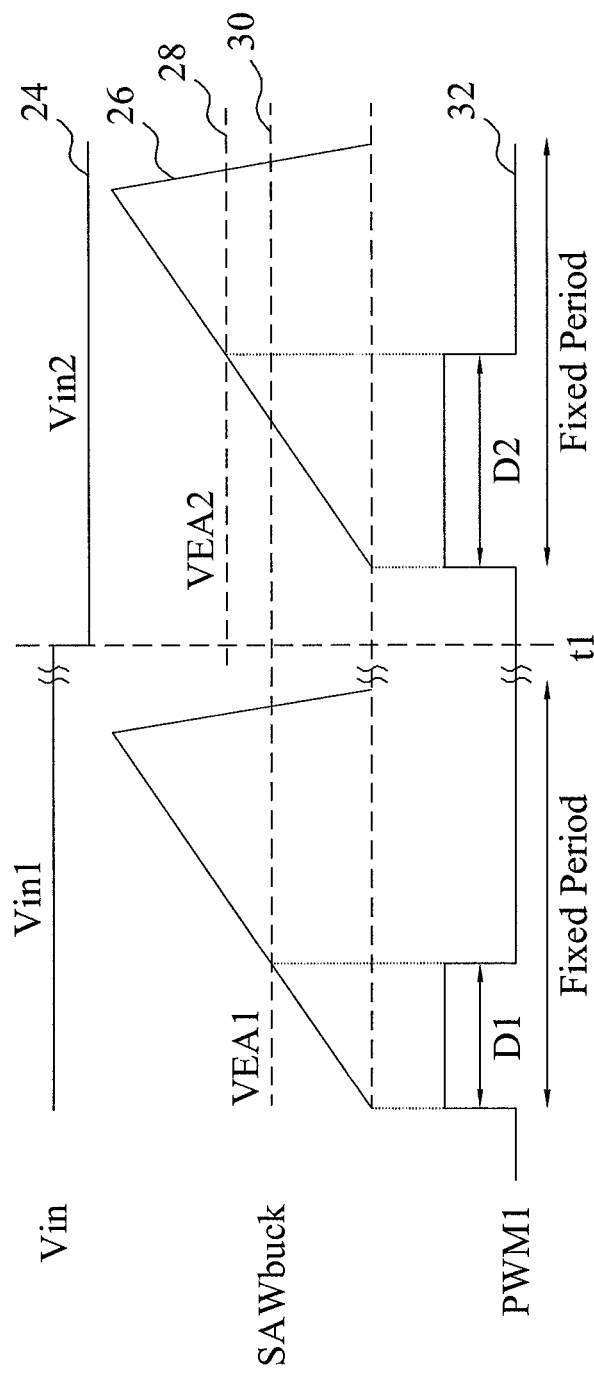
FIG. 2 is a waveform diagram of the power converter shown in FIG. 1.
Figure 3:
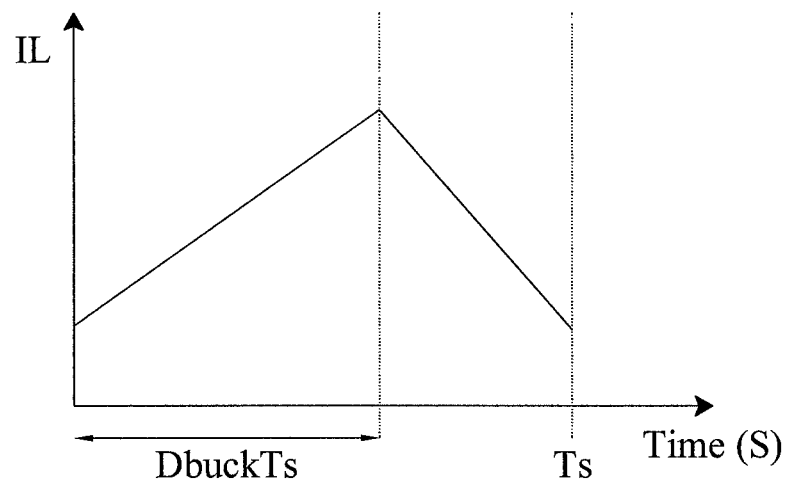
FIG. 3 is a diagram showing the relationship between the duty and the buck ramp signal of a buck-boost power converter operating in a buck mode.
Figure 3:
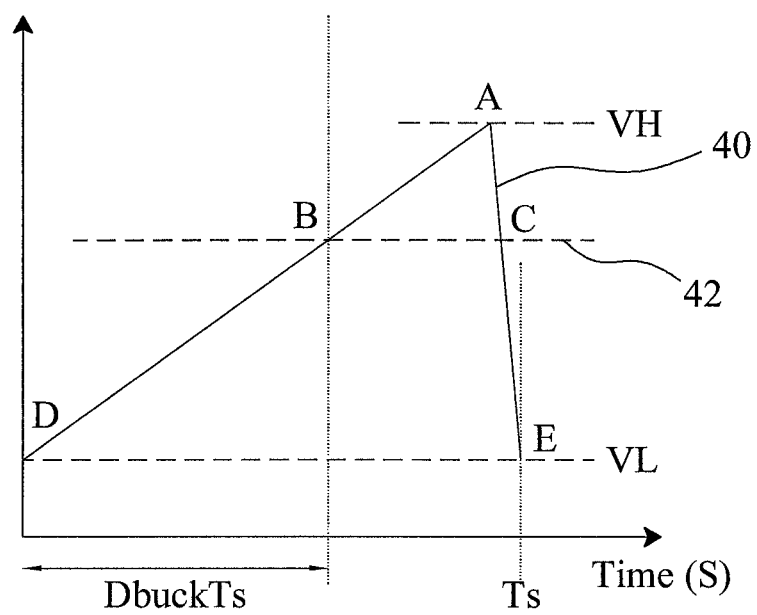

FIG. 3 is a diagram showing the relationship between the duty Dbuck and the buck ramp signal SAWbuck of a buck-boost power converter operating in a buck mode, in which waveform 40 represents the buck ramp signal SAWbuck, waveform 42 represents the error signal VEA, and VH and VL represent the peak value and the valley value of the buck ramp signal SAWbuck, respectively. According to the similar triangles ABC and ADE designated in FIG. 3, the buck-boost power converter in the buck mode has the output/input ratio $$Vout/Vin = Dbuck = (VEA - VL)/(VH - VL). \quad [\text{Eq-1}]$$

Figure 4:
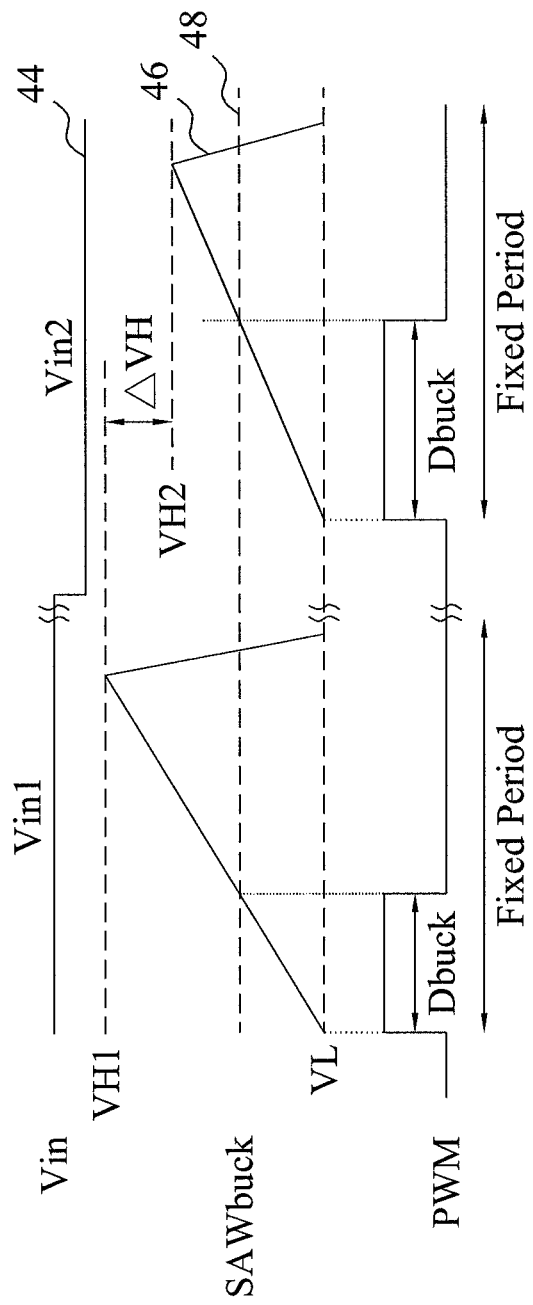
FIG. 4 is a waveform diagram of an embodiment having the peak value of the buck ramp signal adjusted according to the input voltage.

When the input voltage Vin varies, if it is desired to keep the output voltage Vout and the error signal VEA at constant values, one feasible solution is to adjust the valley value VL and the peak value VH of the buck ramp signal SAWbuck, thereby changing the duty Dbuck. Preferably, the valley value VL is fixed and the peak value VH is adjusted according to the varying input voltage Vin. FIG. 4 is a waveform diagram of an embodiment having the peak value of the buck ramp signal SAWbuck adjusted according to the varying input voltage Vin, in which waveform 44 represents the input voltage Vin, waveform 46 represents the buck ramp signal SAWbuck, and waveform 48 represents the error signal VEA. When the input voltage Vin drops down from Vin1 to Vin2, as shown by the waveform 44, the peak value of the buck ramp signal SAWbuck drops down from VH1 to VH2, as shown by the waveform 46. Since the buck ramp signal SAWbuck has a fixed charging time, the increasing slope of the buck ramp signal SAWbuck decreases after the peak value of the buck ramp signal SAWbuck drops down. Therefore, the duty Dbuck increases despite the error signal VEA is not changed, as shown by the waveform 48.

Figure 5:
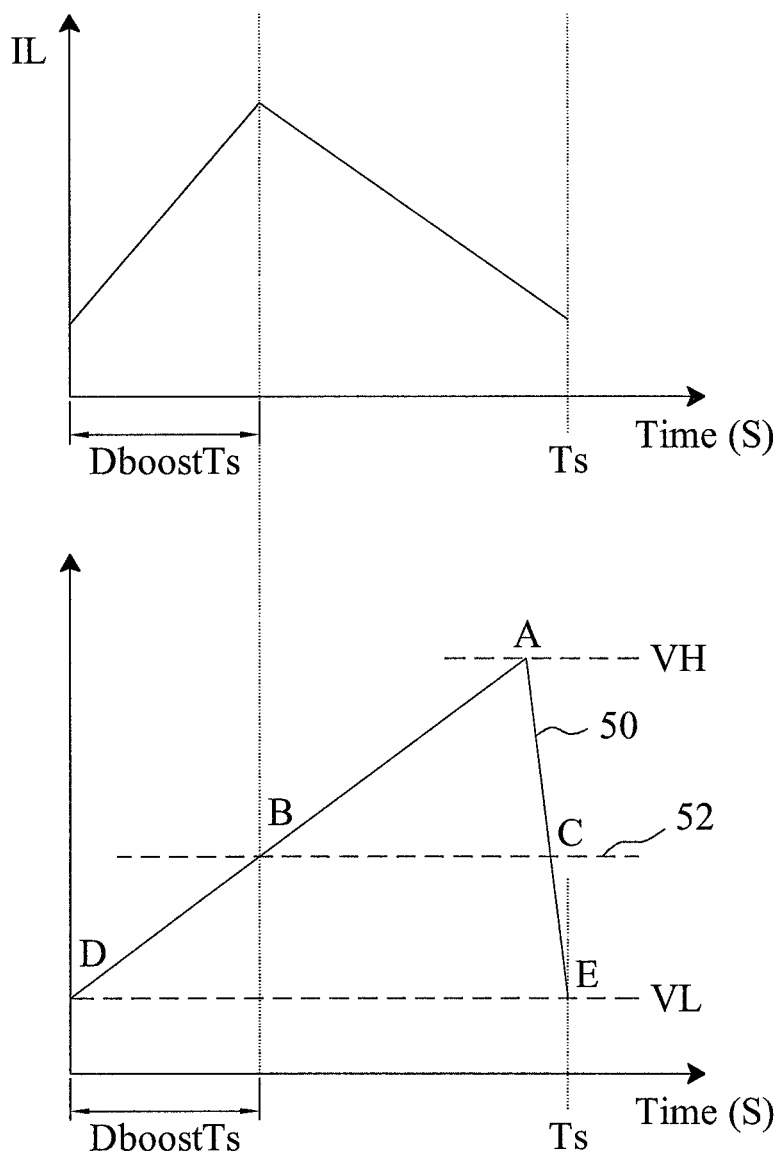
FIG. 5 is a diagram showing the relationship between the duty and the boost ramp signal of a buck-boost power converter operating in a boost mode.

FIG. 5 is a diagram showing the relationship between the duty Dboost and the boost ramp signal SAWboost of a buck-boost power converter operating in a boost mode, in which waveform 50 represents the boost ramp signal SAWboost, and waveform 52 represents the error signal VEA. According to the similar triangles ABC and ADE designated in FIG. 5, the buck-boost power converter in the boost mode has the output/input ratio $$Vout/Vin=1/(1-Dboost)=(VH-VL)/(VH-VEA). \qquad [\text{Eq-2}]$$

Figure 6:
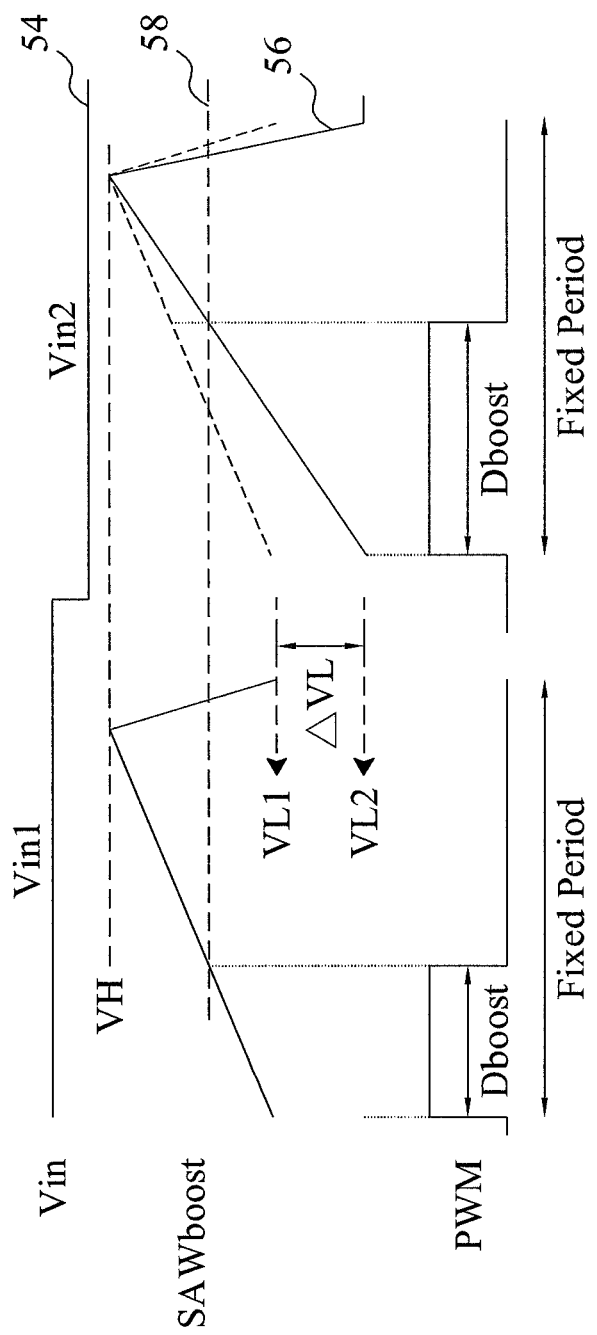
FIG. 6 is a waveform diagram of an embodiment having the valley value of the boost ramp signal adjusted according to the input voltage.

When the input voltage Vin varies, if it is desired to change the duty Dboost without changing the output voltage Vout and the error signal VEA, one feasible solution is to adjust the peak value VH and the valley value VL of the boost ramp signal SAWboost. Preferably, the peak value VH is fixed and the valley value VL is adjusted according to the varying input voltage Vin. FIG. 6 is a waveform diagram of an embodiment having the valley value of the boost ramp signal SAWboost adjusted according to the varying input voltage Vin, in which waveform 54 represents the input voltage Vin, waveform 56 represents the boost ramp signal SAWboost, and waveform 58 represents the error signal VEA. When the input voltage Vin drops down from Vin1 to Vin2, as shown by the waveform 54, the valley value of the boost ramp signal SAWboost drops down from VL1 to VL2, as shown by the waveform 56. After the valley value of the boost ramp signal SAWboost drops down, given that the error signal VEA remains at the same value, as shown by the waveform 58, it takes the boost ramp signal SAWboost more time to reach the error signal VEA. Thus, the duty Dboost increases.

Figure 7:
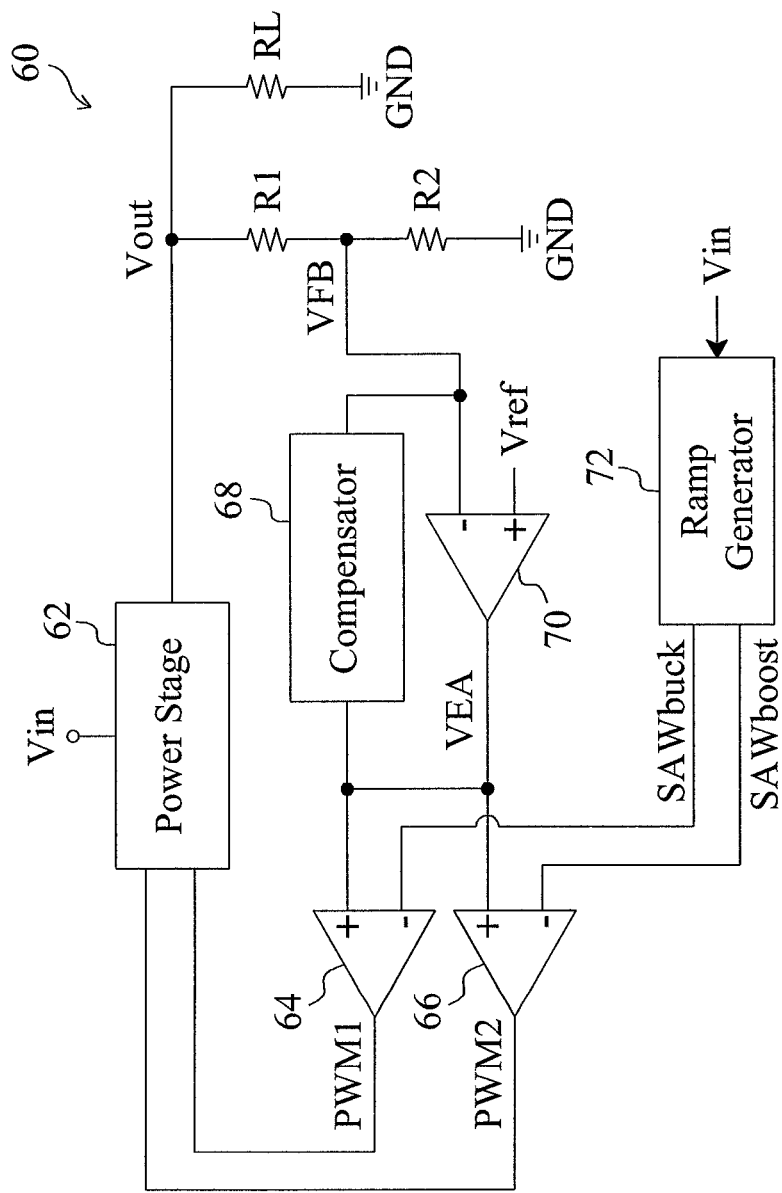
FIG. 7 is a circuit diagram of a buck-boost power converter according to the present invention.

As shown in FIG. 7, a buck-boost power converter 60 according to the present invention includes a power stage 62 to convert an input voltage Vin to an output voltage Vout according to control signals PWM1 and PWM2, voltage divider resistors R1 and R2 to divide the output voltage Vout to generate a feedback signal VFB, an error amplifier 70 to generate an error signal VEA according to the feedback signal VFB and a reference voltage Vref, a compensator 68 to compensate the error signal VEA for stability enhancement of the power converter 60, a ramp generator 72 to monitor the input voltage Vin to provide two ramp signals SAWbuck and SAWboost, and comparators 64 and 66 to compare the error signal VEA with the ramp signals SAWbuck and SAWboost to generate the control signals PWM1 and PWM2, respectively. By using feed-forward technique, the ramp signal SAWbuck has a peak varying with the input voltage Vin, and the ramp signal SAWboost has a valley varying with the input voltage Vin.

Figure 8:
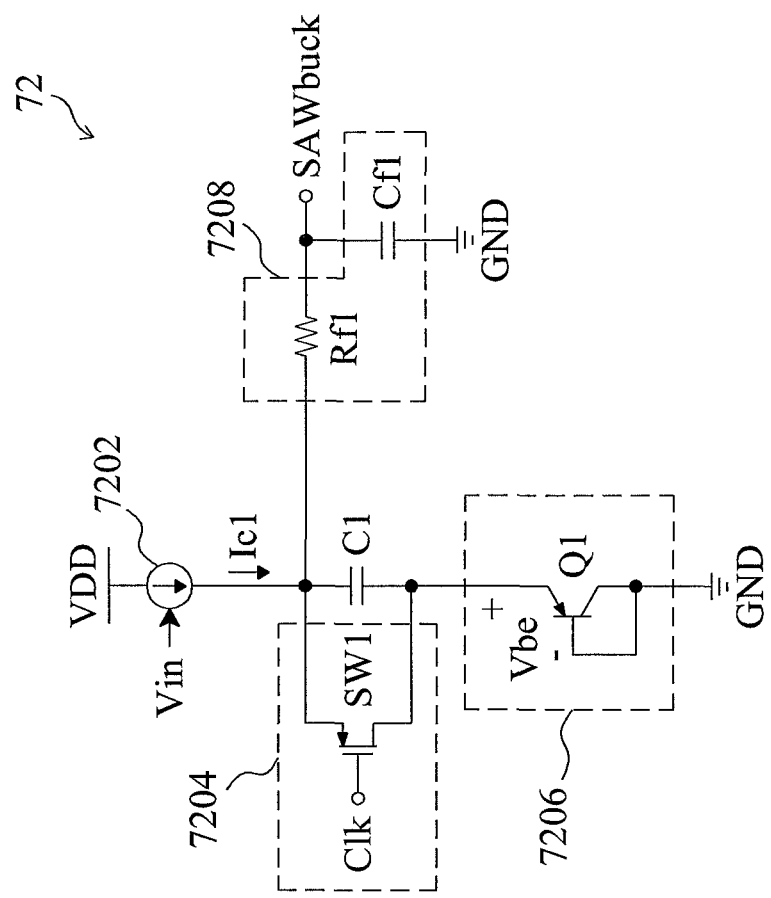
FIG. 8 is a circuit diagram of an embodiment for the ramp generator of FIG. 7 to generate a buck ramp signal.
Figure 9:
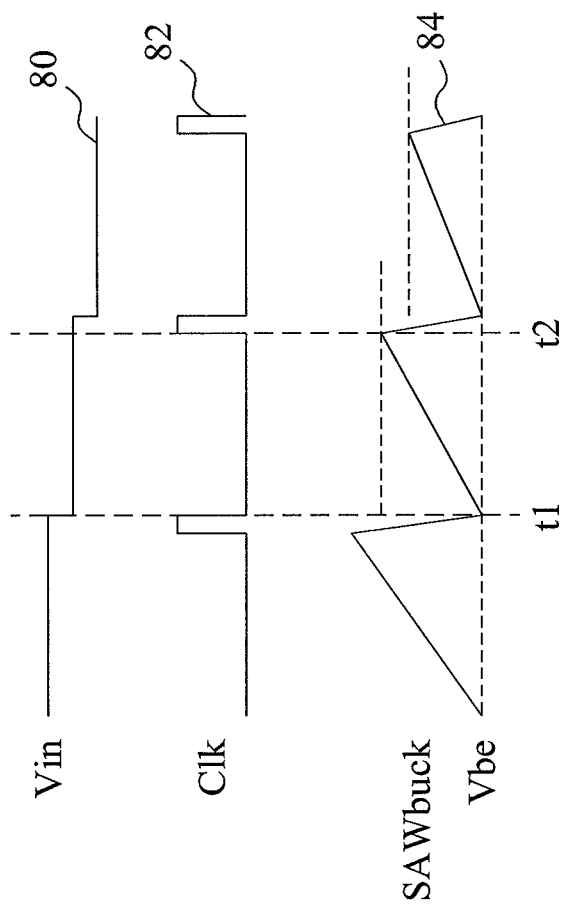
FIG. 9 is a waveform diagram of the ramp generator shown in FIG. 8.

FIG. 8 is a circuit diagram of an embodiment for the ramp generator 72 of FIG. 7 to generate the buck ramp signal SAWbuck, in which a current source 7202 provides a charging current Ic1 proportional to the input voltage Vin to charge a capacitor C1, a control circuit 7204 includes a switch SW1 parallel connected to the capacitor C1 and switched by a clock Clk to control the charging and discharging of the capacitor C1 to generate the buck ramp signal SAWbuck, a limiting circuit 7206 includes a bipolar junction transistor Q1 connected between the capacitor C1 and a ground terminal GND and configured as a diode to fix the valley value of the buck ramp signal SAWbuck, and a low-pass filter 7208 composed of a resistor Rf1 and a capacitor Cf1 filters out the high-frequency noise generated in the buck ramp signal SAWbuck during the transitions of the clock Clk. In this embodiment, the valley value of the buck ramp signal SAWbuck is fixed and the peak value of the buck ramp signal SAWbuck decreases as the input voltage Vin drops. FIG. 9 is a waveform diagram of the ramp generator 72 shown in FIG. 8, in which waveform 80 represents the input voltage Vin, waveform 82 represents the clock Clk, and waveform 84 represents the buck ramp signal SAWbuck. At time t1, the input voltage Vin drops down, as shown by the waveform 80, so that the charging current Ic1, which is proportional to the input voltage Vin, also drops down. On the other hand, since the clock Clk has a fixed period Ts and a fixed pulse width, as shown by the waveform 82, meaning that the capacitor C1 has a fixed charging time, the peak value of the buck ramp signal SAWbuck decreases as a result, as shown by the waveform 84. At time t2, the clock Clk turns on the switch SW1, thereby discharging the capacitor C1. As the voltage difference Vbe exists between the base and the emitter of the transistor Q1, the valley of the buck ramp signal SAWbuck is fixed at Vbe.

Figure 10:
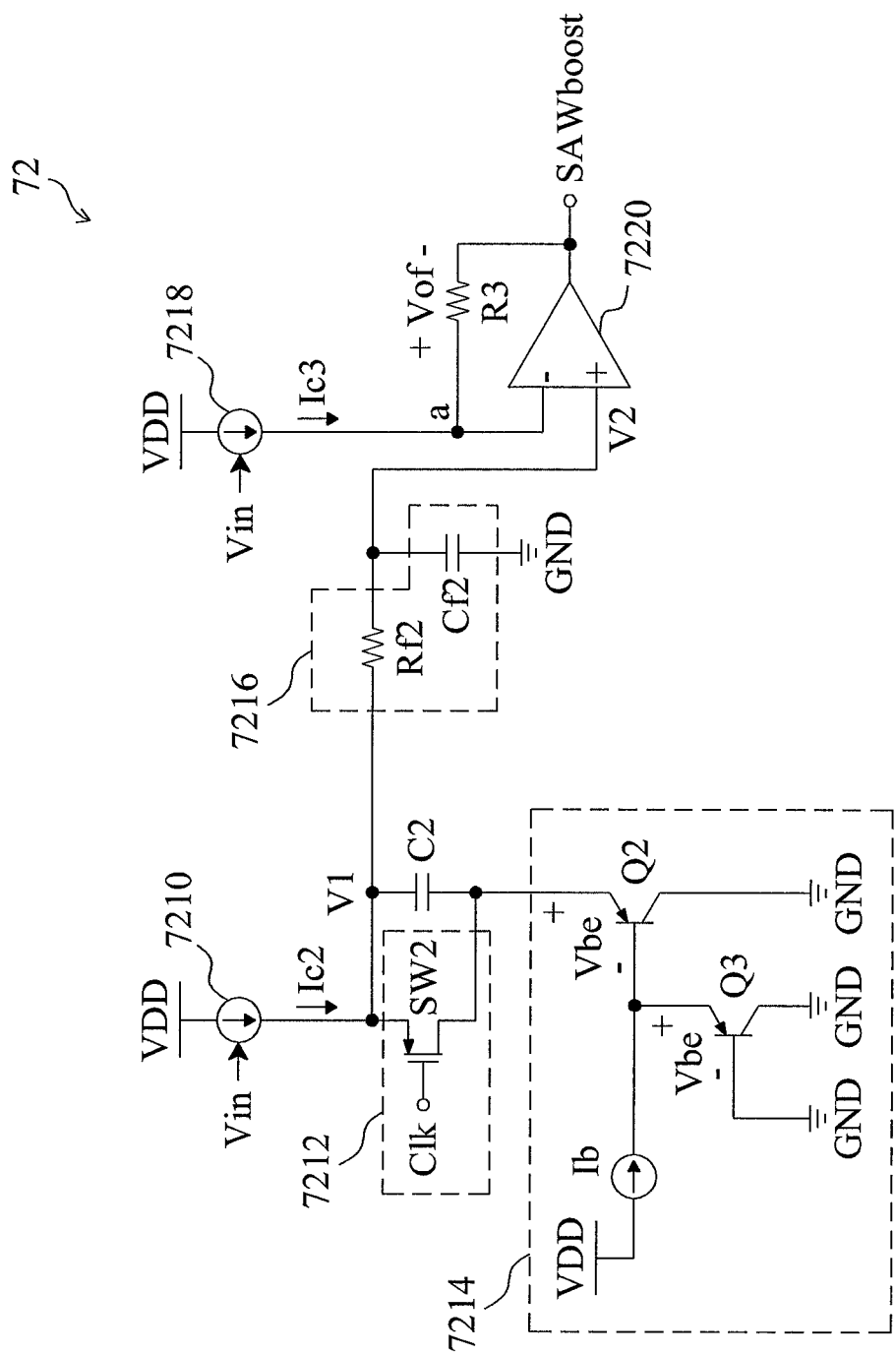
FIG. 10 is a circuit diagram of an embodiment for the ramp generator of FIG. 7 to generate a boost ramp signal.
Figure 11:
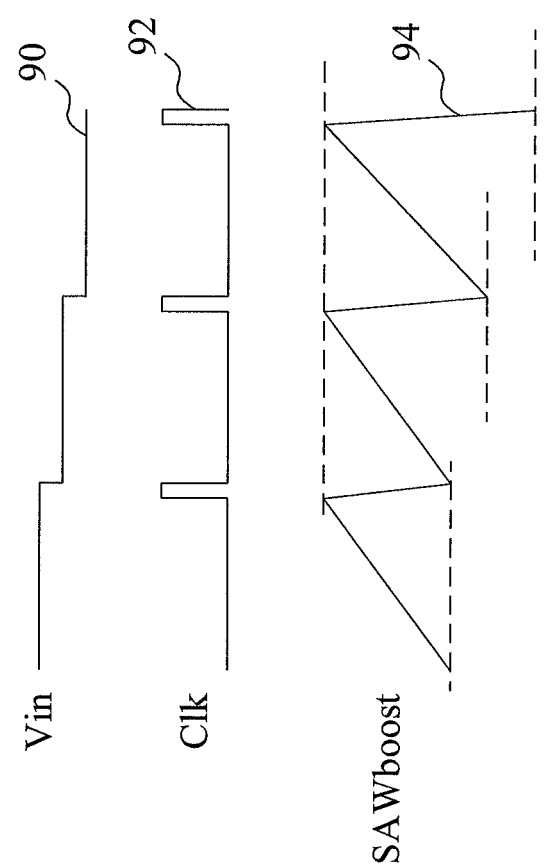
FIG. 11 is a waveform diagram of the ramp generator shown in FIG. 10.

FIG. 10 is a circuit diagram of another embodiment for the ramp generator 72 shown in FIG. 7 to generate the boost ramp signal SAWboost, and FIG. 11 is a waveform diagram thereof. Referring to FIG. 10, a current source 7210 generates a charging current Ic2 inversely proportional to the input voltage Vin to charge a capacitor C2, a control circuit 7212 includes a switch SW2 parallel connected to the capacitor C2 and switched by a clock Clk having a fixed period and a fixed pulse width, as shown by the waveform 92 of FIG. 11, to control the charging and discharging of the capacitor C2 to generate a charging voltage V1, a limiting circuit 7214 includes two bipolar junction transistors Q2 and Q3 configured as diodes connected between the capacitor C2 and a ground terminal GND to fix the minimum value of the charging voltage V1 at twice of Vbe, a low-pass filter 7216 composed of a resistor Rf2 and a capacitor Cf2 filters out the high-frequency noise in the charging voltage V1 to generate a voltage V2, an operational amplifier 7220 reflects the voltage V2 to a node a, and a current source 7218 generates a charging current Ic3 inversely proportional to the input voltage Vin to inject into a resistor R3 to generate a direct-current (DC) offset voltage Vof which is subtracted from the voltage V2 at the node a to thereby generate the boost ramp signal SAWboost. When the input voltage Vin drops down, as shown by the waveform 90 of FIG. 11, the peak value of the charging voltage V1 increases so that the peak value of the voltage V2 increases. However, the offset voltage Vof also increases as the input voltage Vin drops down, and in consequence the voltage V2 is pulled down by the offset voltage Vof, resulting in the boost ramp signal SAWboost whose peak value is fixed but whose valley value decreases as the input voltage Vin drops down, as shown by the waveform 94 of FIG. 11.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for generating a ramp signal for a buck-boost power converter, the method comprising the steps of:
   A.) monitoring an input voltage being converted to an output voltage by the buck-boost power converter; and
   B.) providing a first positive slope ramp signal and a second positive slope ramp signal according to a variation of the input voltage;
   wherein the first positive slope ramp signal has a peak value varying with the input voltage, and the second positive slope ramp signal has a valley value varying with the input voltage.

2. The method of claim 1, wherein the step B comprises the steps of:
   providing a charging current proportional to the input voltage to charge a capacitor to generate the first positive slope ramp signal whose peak value decreases as the input voltage drops down; and
   fixing a valley value of the first positive slope ramp signal.

3. The method of claim 2, further comprising low-pass filtering the first positive slope ramp signal to filter out high-frequency noise in the first positive slope ramp signal.

4. The method of claim 1, wherein the step B comprises the steps of:
   providing a charging current inversely proportional to the input voltage to charge a capacitor to generate a charging voltage;
   fixing a minimum value of the charging voltage;
   providing an offset voltage inversely proportional to the input voltage; and
   subtracting the offset voltage from the charging voltage to generate the second positive slope ramp signal whose peak value is fixed and whose valley value decreases as the input voltage drops down.

5. The method of claim 4, further comprising low-pass filtering the charging voltage to filter out high-frequency noise in the charging voltage.

6. The method of claim 1, wherein each of the first and second positive slope ramp signals has a fixed period.

7. A ramp generator for a buck-boost power converter which converts an input voltage to an output voltage, the ramp generator comprising:
   a capacitor;
   a current source connected to the capacitor, for providing a charging current varying with the input voltage to charge the capacitor;
   a control circuit connected to the capacitor, for controlling charging and discharging of the capacitor so as to generate a ramp signal having a peak value decreases as the input voltage drops down; and
   a limiting circuit connected to the capacitor, for fixing a valley value of the ramp signal.

8. The ramp generator of claim 7, wherein the charging current is proportional to the input voltage.

9. The ramp generator of claim 7, wherein the control circuit comprises a switch parallel connected to the capacitor.

10. The ramp generator of claim 7, wherein the limiting circuit comprises a bipolar junction transistor connected between the capacitor and a ground terminal and configured as a diode.

11. The ramp generator of claim 7, thither comprising a low-pass filter connected to the capacitor, for filtering out high-frequency noise in the ramp signal.

12. The ramp generator of claim 7, wherein the ramp signal has a fixed period.

13. A ramp generator for a buck-boost power converter which converts an input voltage to an output voltage, the ramp generator comprising:
   a capacitor;
   a current source connected to the capacitor, for providing a charging current varying with the input voltage to charge the capacitor;
   a control circuit connected to the capacitor, for controlling charging and discharging of the capacitor so as to generate a charging voltage having a peak value varying with the input voltage;
   a limiting circuit connected to the capacitor, for fixing a minimum value of the charging voltage; and
   a voltage source connected to the capacitor, for providing an offset voltage varying
      with the input voltage, the offset voltage being subtracted from the charging voltage to generate a ramp signal having a fixed peak value and a valley value decreasing as the input voltage drops down.

14. The ramp generator of claim 13, wherein the charging current is proportional to the input voltage.

15. The ramp generator of claim 13, wherein the offset voltage is inversely proportional to the input voltage.

16. The ramp generator of claim 13, wherein the control circuit comprises a switch parallel connected to the capacitor.

17. The ramp generator of claim 13, wherein the limiting circuit comprises a bipolar junction transistor connected between the capacitor and a ground terminal and configured as a diode.

18. The ramp generator of claim 13, further comprising a low-pass filter connected to the capacitor, for filtering out high-frequency noise in the charging voltage.

19. The ramp generator of claim 13, wherein the ramp signal has a fixed period.

20. A buck-boost power converter, comprising:
   a power stage for converting an input voltage to an output voltage according to a first control signal and a second control signal;
   an error amplifier for generating an error signal according to a reference voltage and a feedback signal proportional to the output voltage;
   a ramp generator for providing a first positive slope ramp signal and a second positive slope ramp signal, wherein the first positive slope ramp signal has a peak value varying with the input voltage, and the second positive slope ramp signal has a valley value varying with the input voltage;
   a first comparator for generating the first control signal according to the error signal and the first positive slope ramp signal; and
   a second comparator for generating the second control signal according to the error signal and the second positive slope ramp signal.

21. The buck-boost power converter of claim 20, wherein the ramp generator comprises:
   a capacitor;
   a current source connected to the capacitor, for providing a charging current varying with the input voltage to charge the capacitor;
   a control circuit connected to the capacitor, for controlling charging and discharging of the capacitor so as to generate the first positive slope ramp signal, wherein the peak value of the first positive slope ramp signal decreases as the input voltage drops down; and a limiting circuit connected to the capacitor, for fixing a valley value of the first positive slope ramp signal.

22. The buck-boost power converter of claim 21, wherein the control circuit comprises a switch parallel connected to the capacitor.

23. The buck-boost power converter of claim 21, wherein the limiting circuit comprises a bipolar junction transistor connected between the capacitor and a ground terminal and configured as a diode.

24. The buck-boost power converter of claim 21, further comprising a low-pass filter connected to the capacitor, for filtering out high-frequency noise in the first positive slope ramp signal.

25. The buck-boost power converter of claim 20, wherein the ramp generator comprises:

a capacitor;

a current source connected to the capacitor, for providing a charging current inversely proportional to the input voltage to charge the capacitor;

a control circuit connected to the capacitor, for controlling charging and discharging of the capacitor so as to generate a charging voltage which has a peak value increasing as the input voltage drops down;

a limiting circuit connected to the capacitor, for fixing a minimum value of the charging voltage; and a voltage source connected to the capacitor, for providing an offset voltage inversely proportional to the input voltage, the offset voltage being subtracted from the charging voltage to generate the second positive slope ramp signal.

26. The buck-boost power converter of claim 25, wherein the control circuit comprises a switch parallel connected to the capacitor.

27. The buck-boost power converter of claim 25, wherein the limiting circuit comprises a bipolar junction transistor connected between the capacitor and a ground terminal and configured as a diode.

28. The buck-boost power converter of claim 25, further comprising a low-pass filter connected to the capacitor, for filtering out high-frequency noise in the charging voltage.

29. The buck-boost power converter of claim 20, wherein each of the first and second positive slope ramp signals has a fixed period.

30. A control method for a buck-boost power converter, the control method comprising the steps of:

A.) generating an error signal according to a reference voltage and a feedback signal proportional to an output voltage of the buck-boost power converter;

B.) providing a first positive slope ramp signal and a second positive slope ramp signal, wherein the first positive slope ramp signal has a peak value varying with an input voltage being converted to the output voltage by the buck-boost power converter, and the second positive slope ramp signal has a valley value varying with the input voltage; and C.) modulating the output voltage according to the error signal, the first positive slope ramp signal, and the second positive slope ramp signal.

31. The control method of claim 30, wherein the step B comprises the steps of:

providing a charging current proportional to the input voltage for charging a capacitor to generate the first positive slope ramp signal, wherein the peak value of the first positive slope ramp signal decreases as the input voltage drops down; and fixing a valley value of the first positive slope ramp signal.

32. The control method of claim 31, further comprising low-pass filtering the first positive slope ramp signal to filter out high-frequency noise in the first positive slope ramp signal.

33. The control method of claim 30, wherein the step B comprises the steps of:

providing a charging current inversely proportional to the input voltage for charging a capacitor to generate a charging voltage;

fixing a minimum value of the charging voltage;

providing an offset voltage inversely proportional to the input voltage; and subtracting the offset voltage from the charging voltage to thereby generate the second positive slope ramp signal, wherein a peak value of the second positive slope ramp signal is fixed, and the valley value of the second positive slope ramp signal decreases as the input voltage drops down.

34. The control method of claim 33, further comprising low-pass filtering the charging voltage to filter out high-frequency noise in the charging voltage.

35. The control method of claim 30, wherein each of the first and second positive slope ramp signals has a fixed period.

* * * * *